(12) United States Patent
Cheng et al.

(10) Patent No.: US 12,146,999 B2
(45) Date of Patent: Nov. 19, 2024

(54) AMPLIFIER FOR DARK NOISE COMPENSATION

(71) Applicant: SHENZHEN XPECTVISION TECHNOLOGY CO., LTD., Shenzhen (CN)

(72) Inventors: Huabin Cheng, Shenzhen (CN); Zhigang Wang, Shenzhen (CN); Xin Li, Shenzhen (CN)

(73) Assignee: SHENZHEN XPECTVISION TECHNOLOGY CO., LTD., Shenzhen (CN)

( * ) Notice: Subject to any disclaimer, the term of this patent is extended or adjusted under 35 U.S.C. 154(b) by 452 days.

(21) Appl. No.: 17/572,715

(22) Filed: Jan. 11, 2022

(65) Prior Publication Data

US 2022/0128719 A1   Apr. 28, 2022

Related U.S. Application Data

(63) Continuation of application No. PCT/CN2019/098160, filed on Jul. 29, 2019.

(51) Int. Cl.
G01T 1/24 (2006.01)
H03F 3/45 (2006.01)

(52) U.S. Cl.
CPC .......... *G01T 1/247* (2013.01); *H03F 3/45475* (2013.01)

(58) Field of Classification Search
CPC ........... G01T 1/247; H03F 3/45475; H03F 2203/45512; H03F 2203/45524; H03F 3/70

See application file for complete search history.

(56) References Cited

U.S. PATENT DOCUMENTS

| 4,681,440 A | * | 7/1987 | Burke | ............ H01L 27/14875 257/E27.16 |
| 5,847,599 A | * | 12/1998 | Zhang | ................ H03F 1/303 330/9 |
| 11,139,293 B2 | * | 10/2021 | Ichikawa | ............ H01L 31/115 |
| 2004/0117224 A1 | * | 6/2004 | Agarwal | ............ G06Q 20/1235 705/412 |
| 2008/0018890 A1 | | 1/2008 | Maity et al. | |
| 2009/0167432 A1 | | 7/2009 | Van den Heuvel | |
| 2017/0012638 A1 | * | 1/2017 | Furuta | ................. H04B 1/16 |

FOREIGN PATENT DOCUMENTS

| CN | 104020484 A | | 9/2014 |
| CN | 108132101 A | * | 6/2018 |
| CN | 109716165 A | | 5/2019 |
| EP | 1016882 A2 | | 7/2000 |
| JP | 08129070 A | * | 5/1996 |
| JP | H08129070 A | | 5/1996 |
| WO | 2016161542 A1 | | 10/2016 |
| WO | WO-2018097025 A1 | * | 5/2018 | ............ G01J 1/4228 |

OTHER PUBLICATIONS

Anonymous: "mosfet as a capacitor | Forum for Electronics", Jun. 27, 2011 (Jun. 27, 2011), XP093029499, Retrieved from the Internet: URL: https://www.edaboard.com/threads/mosfet-as-a-capacitor. 67055/ [retrieved on Mar. 7, 2023].

* cited by examiner

*Primary Examiner* — Christine S. Kim
(74) *Attorney, Agent, or Firm* — IPro, PLLC (57) ABSTRACT

Disclosed herein is an amplifier, comprising: an op-amp configured to receive at an input thereof a first electric current; a first MOS capacitor connected to the input and an output of the op-amp.

16 Claims, 10 Drawing Sheets

AMPLIFIER FOR DARK NOISE COMPENSATION

BACKGROUND

A radiation detector is a device that measures a property of a radiation. Examples of the property may include a spatial distribution of the intensity, phase, and polarization of the radiation. The radiation may be one that has interacted with a subject. For example, the radiation measured by the radiation detector may be a radiation that has penetrated or reflected from the subject. The radiation may be an electromagnetic radiation such as infrared light, visible light, ultraviolet light, X-ray or y-ray. The radiation may be of other types such as α-rays and β-rays.

One type of radiation detectors is based on interaction between the radiation and a semiconductor. For example, a radiation detector of this type may have a semiconductor layer that absorbs the radiation and generate charge carriers (e.g., electrons and holes) and circuitry for detecting the charge carriers.

Radiation detectors may be negatively impacted by dark noise (e.g., dark current). Dark noise in a radiation detector includes physical effects present even if no radiation the radiation detector is configured to detect is incident on the radiation detector. Isolating or reducing the impact of the dark noise to the overall signals detected by the radiation detector is helpful to make the radiation detector more useful. An approach to reduce the impact of dark noise is to compensate for the dark noise by determining and removing dark noise contribution in a signal measurement circuitry of the radiation detector.

SUMMARY

Disclosed herein is an amplifier, comprising: an op-amp configured to receive at an input thereof a first electric current; a first MOS capacitor connected to the input and an output of the op-amp.

According to an embodiment, the amplifier further comprises an adjustable current source feeding a second electric current to the input.

According to an embodiment, the first MOS capacitor is a MOSFET with its source electrode shorted to its drain electrode.

According to an embodiment, the source electrode and the drain electrode are connected to the output of the op-amp, and a gate electrode of the MOSFET is connected to the input of the op-amp.

According to an embodiment, the source electrode and the drain electrode are connected to the input of the op-amp, and a gate electrode of the MOSFET is connected to the output of the op-amp.

According to an embodiment, the adjustable current source is adjustable by an electric signal.

According to an embodiment, the adjustable current source comprises a second MOS capacitor.

According to an embodiment, the adjustable current source comprises a third MOS capacitor in parallel to the second MOS capacitor; wherein a gate electrode of the third MOS capacitor is connected to the input of the op-amp and a bulk contact of the third MOS capacitor is connected to the electric signal.

According to an embodiment, the first electric current comprises a dark noise of a radiation detector; wherein the adjustable current source is configured to compensate for the dark noise.

According to an embodiment, the amplifier further comprises a processor configured to generate the electric signal based on a level at the output.

According to an embodiment, the processor is configured to generate the electric signal further based on an output of a comparator.

According to an embodiment, the processor comprises a charge pump.

According to an embodiment, the charge pump is configured to be switched on and off by a clock signal.

Disclosed herein is a radiation detector, comprising: a radiation absorption layer comprising an electrode; the amplifier wherein the first electric current is from the electrode and the amplifier is configured to produce a voltage at the output based on the first electric current; a first voltage comparator configured to compare a voltage of the electrode to a first threshold; a second voltage comparator configured to compare the voltage to a second threshold; a counter configured to register a number of particles of radiation absorbed by the radiation absorption layer; a controller; wherein the controller is configured to start a time delay from a time at which the first voltage comparator determines that an absolute value of the voltage equals or exceeds an absolute value of the first threshold; wherein the controller is configured to activate the second voltage comparator during the time delay; wherein the controller is configured to cause the number registered by the counter to increase by one, if the second voltage comparator determines that an absolute value of the voltage equals or exceeds an absolute value of the second threshold.

According to an embodiment, the radiation is X-ray.

According to an embodiment, the controller is configured to activate the second voltage comparator at a beginning or expiration of the time delay.

According to an embodiment, the radiation detector further comprises a voltmeter, wherein the controller is configured to cause the voltmeter to measure the voltage upon expiration of the time delay.

According to an embodiment, the controller is configured to determine radiation of a particle of radiation based on a value of the voltage measured upon expiration of the time delay.

According to an embodiment, the controller is configured to connect the electrode of the radiation absorption layer to an electrical ground.

According to an embodiment, a rate of change of the voltage is substantially zero at expiration of the time delay.

According to an embodiment, a rate of change of the voltage is substantially non-zero at expiration of the time delay.

According to an embodiment, the radiation absorption layer comprises silicon, germanium, GaAs, CdTe, CdZnTe, or a combination thereof.

According to an embodiment, the radiation detector does not comprise a scintillator.

According to an embodiment, the radiation detector comprises an array of pixels.

DETAILED DESCRIPTION

Figure 1A:
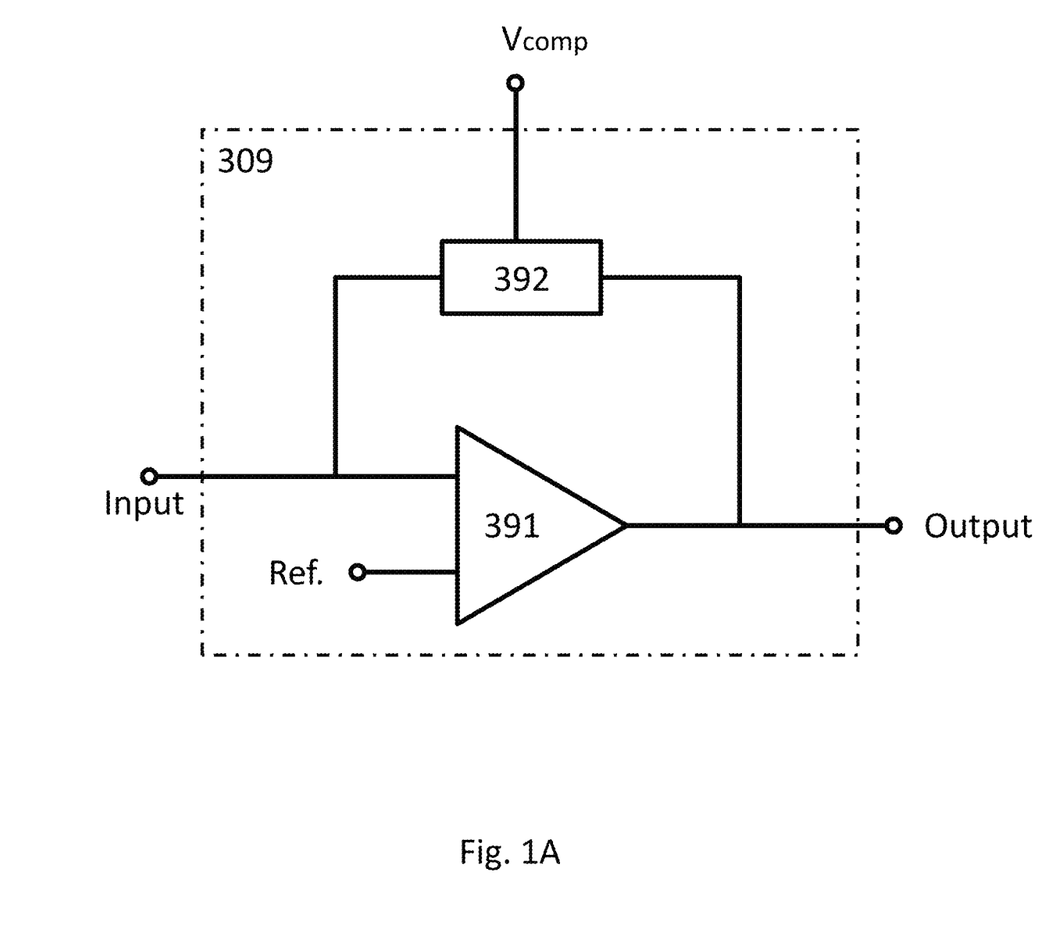
FIG. 1A schematically shows a component diagram of an amplifier, according to an embodiment.

FIG. 1A schematically shows a component diagram of an amplifier 309, according to an embodiment. The amplifier 309 includes an op-amp 391. The op-amp 391 has an input and an output. The op-amp 391 is configured to receive a first electric current at the input. The amplifier 309 may be configured to produce an amplified electric signal (e.g. electric voltage) at the output based on the first electric current.

Figure 1B:
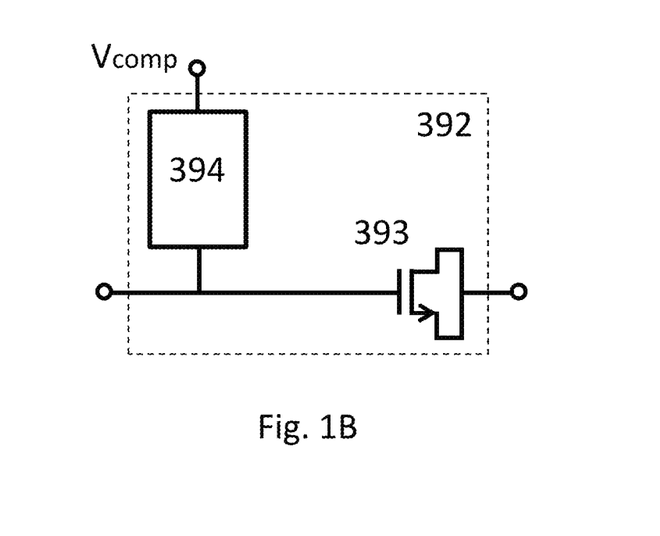
FIG. 1B-FIG. 1C each schematically show detailed component diagrams of the amplifier, according to an embodiment.
Figure 1C:
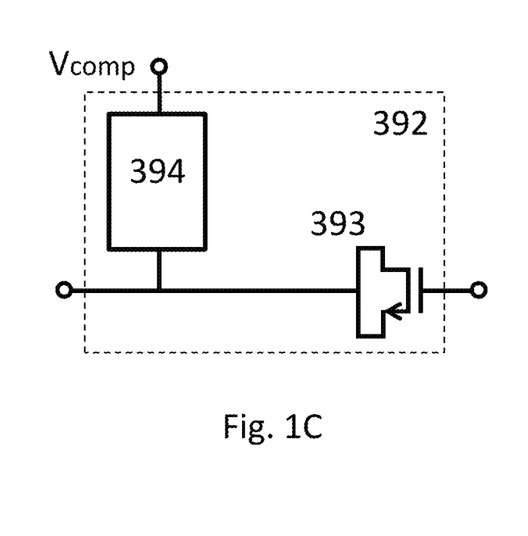

As shown in FIG. 1B and FIG. 1C, the amplifier 309 has a first MOS capacitor 393, which is a component in a feedback circuit 392 between the input and output of the op-amp 391. The first MOS capacitor 393 is connected to the input and the output of the op-amp 391. As shown in FIG. 1B and FIG. 1C, the first MOS capacitor 393 may be a MOSFET with its source electrode shorted to its drain electrode. In one embodiment, the source electrode and the drain electrode of the first MOS capacitor 393 are connected to the output of the op-amp 391, and a gate electrode of the first MOS capacitor 393 is connected to the input of the op-amp 391, as shown in FIG. 1B. In one embodiment, the source electrode and the drain electrode are connected to the input of the op-amp 391, and the gate electrode of the first MOS capacitor 393 is connected to the output of the op-amp 391, as shown in FIG. 1C.

In an embodiment, the amplifier 309 includes an adjustable current source 394, which is a component in the feedback circuit 392. The adjustable current source 394 feeds a second electric current to the input of the op-amp 391. The second electric current may flow from or into the input of the op-amp 391. The adjustable current source 394 may be adjustable by an electric signal Vcomp. For example, the magnitude and direction of the second electric current depend on the electric signal Vcomp. The electric signal Vcomp may be an electric voltage but may be other types of electric signals. In one embodiment, when the first electric current at the input of the amplifier 309 includes a dark noise of a radiation detector, the adjustable current source 394 is configured to compensate for the dark noise, for example, by varying the magnitude and direction of the second electric current.

Figure 1D:
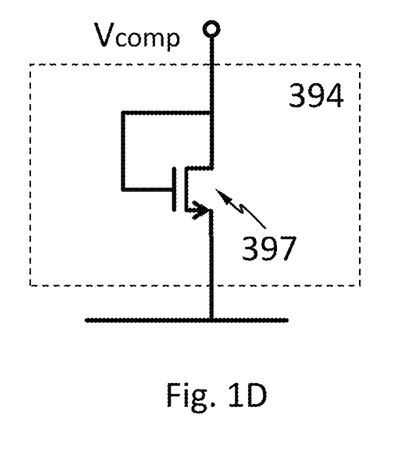
FIG. 1D and FIG. 1E each schematically show a configuration of an adjustable current source of the amplifier, according to an embodiment.
Figure 1E:
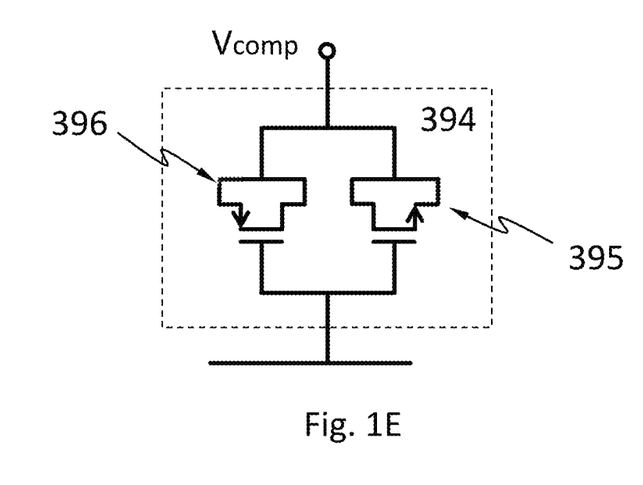

FIG. 1D and FIG. 1E each schematically show a configuration of the adjustable current source 394, according to an embodiment. In the configuration shown in FIG. 1D, the adjustable current source 394 includes a diode-connected NMOSFET 397 with a gate electrode and a drain electrode short-connected. The diode-connected NMOSFET 397 functions as a biased diode, feeding the second electric current to the input of the op-amp 391 as a function of the electric signal Vcomp received at the drain electrode. In this configuration, the second electric current flows from the drain electrode to the source electrode.

In the configuration shown in FIG. 1E, the adjustable current source 394 includes a second MOS capacitor 395. The second MOS capacitor 395 may be a NMOSFET with its source electrode shorted to its drain electrode. In an embodiment, the adjustable current source 394 further includes the third MOS capacitor 396, which may be a PMOSFET with its source electrode shorted to its drain electrode. The second MOS capacitor 395 and the third MOS capacitor 396 may be connected in parallel. A gate electrode of the second MOS capacitor 395 is connected to the input of the op-amp 391, and a bulk contact of the second MOS capacitor 395 is configured to receive the electric signal Vcomp. A gate electrode of the third MOS capacitor 396 is connected to the input of the op-amp 391, and a bulk contact of the third MOS capacitor 396 is configured to receive the electric signal Vcomp. With this configuration, the adjustable current source 394 may source the second electric current bi-directionally, e.g., depending on Vcomp, directions of the second electric may change between flowing from the adjustable current source 394 to the input of the op-amp 391, and flowing from the input of op-amp 391 to the adjustable current source 394.

Figure 1F:
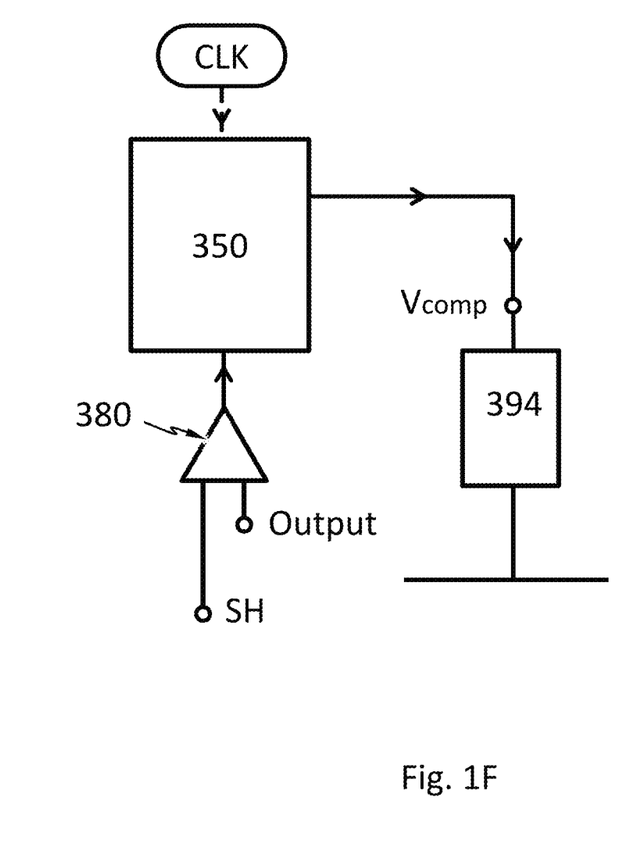
FIG. 1F schematically shows that the amplifier may further include a processor, according to an embodiment.

The electric signal Vcomp may be empirically chosen to allow sufficient compensation for the dark noise in the output of the op-amp 391. The electric signal Vcomp may alternatively be determined based on the output of the op-amp 391. FIG. 1F schematically shows that the amplifier 309 may further include a processor 350, according to an embodiment. The processor 350 is configured to determine the electric signal Vcomp based on a level at the output of the op-amp 391 and optionally further based on an output of a comparator 380 that compares the output of the op-amp 391 with a threshold SH.

Figure 1G:
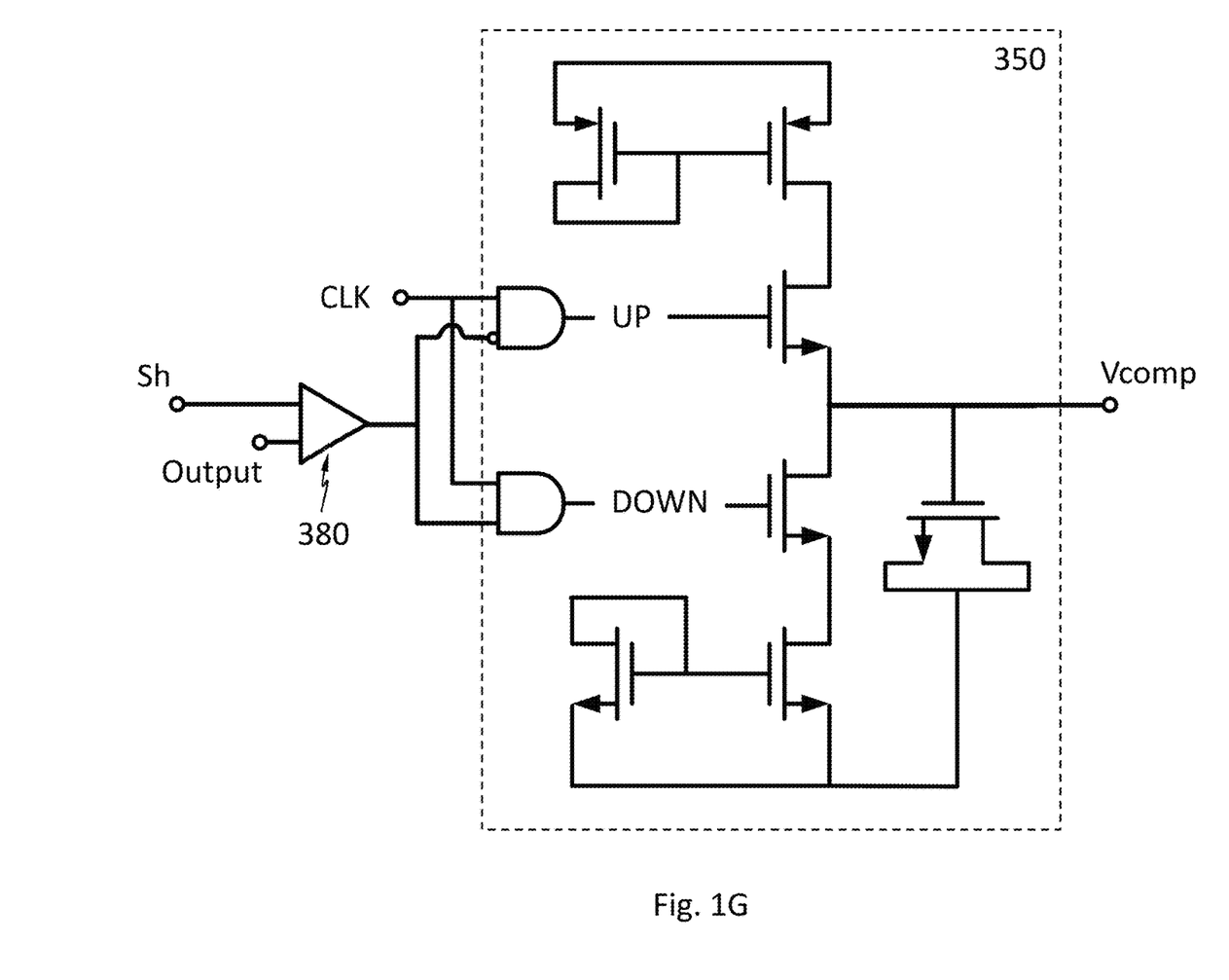
FIG. 1G shows an example of the processor with a charge pump, according to an embodiment.

The processor 350 may further include a charge pump. The charge pump may be configured to be switched on and off by a clock signal CLK. The electric signal Vcomp may be determined for each individual pixel of a radiation detector and applied to the adjustable current source 394 for that pixel. The electric signal Vcomp may be determined based on one pixel's or several pixels' dark noise, and be applied to one or several pixels' adjustable current sources 394. FIG. 1G shows an example of the processor 350 with the charge pump.

Figure 2:
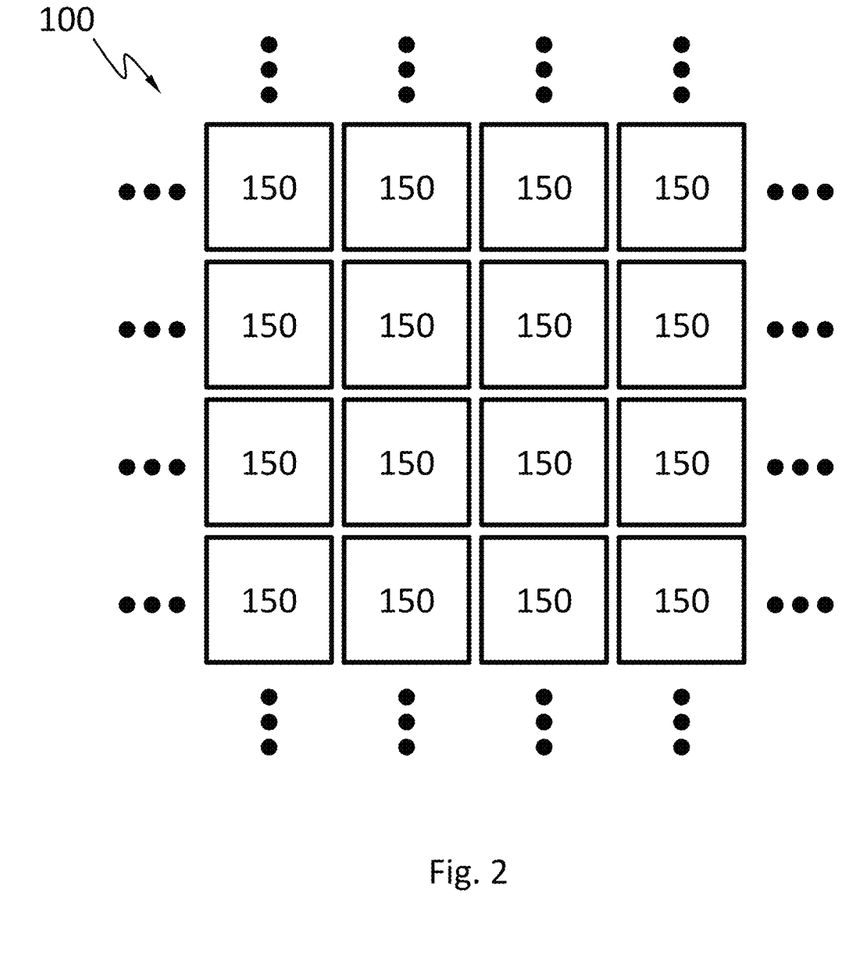
FIG. 2 schematically shows a top view of a portion of a radiation detector, according to an embodiment.

FIG. 2 schematically shows a radiation detector 100 comprising the amplifier 309 described herein, as an example. The radiation detector 100 may have an array of pixels 150. The array may be a rectangular array, a honeycomb array, a hexagonal array or any other suitable array. Each pixel 150 is configured to detect radiation from a radiation source incident thereon and may be configured measure a characteristic (e.g., the energy of the particles, the wavelength, and the frequency) of the radiation. For example, each pixel 150 is configured to count numbers of particles of radiation incident thereon whose energy falls in a plurality of bins, within a period of time. All the pixels 150 may be configured to count the numbers of particles of radiation incident thereon within a plurality of bins of energy within the same period of time. Each pixel 150 may have its own analog-to-digital converter (ADC) configured to digitize an analog signal representing the energy of an incident particle of radiation into a digital signal. The pixels 150 may be configured to operate in parallel. For example, when one pixel 150 measures an incident particle of radiation, another pixel 150 may be waiting for a particle of radiation to arrive. The pixels 150 may not have to be individually addressable. Each pixel 150 may be configured to measure its dark current, such as before or concurrently with each particle of radiation incident thereon. Each pixel 150 may be configured to deduct the contribution of the dark current from the energy of the particle of radiation incident thereon.

Figure 3A:
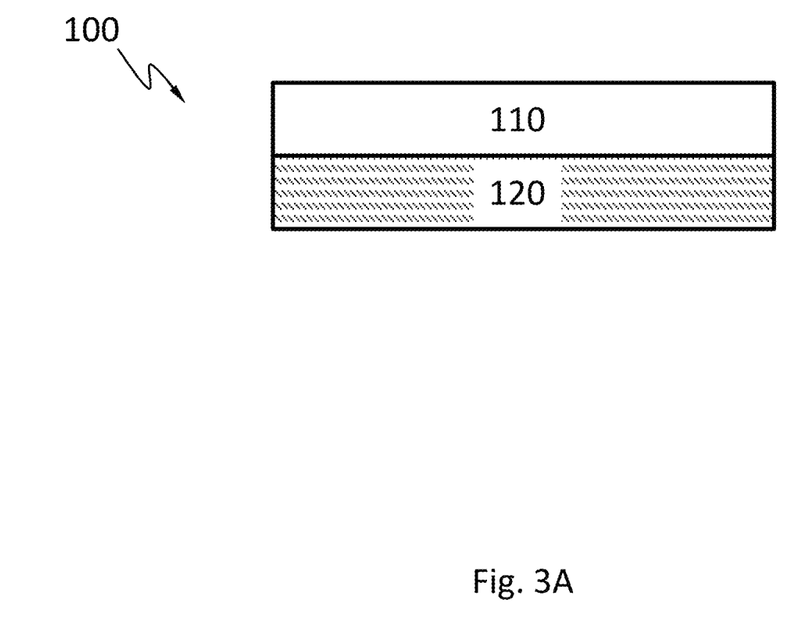
FIG. 3A schematically shows a cross-sectional view of the radiation detector.

FIG. 3A schematically shows a cross-sectional view of the radiation detector 100, according to an embodiment. The radiation detector 100 may include a radiation absorption layer 110 and an electronics layer 120 (e.g., an ASIC) for processing or analyzing electrical signals incident radiation generates in the radiation absorption layer 110. The radiation detector 100 may or may not include a scintillator. The radiation absorption layer 110 may include a semiconductor material such as, silicon, germanium, GaAs, CdTe, CdZnTe, or a combination thereof. The semiconductor may have a high mass attenuation coefficient for the radiation of interest. The radiation may be X-ray.

Figure 3B:
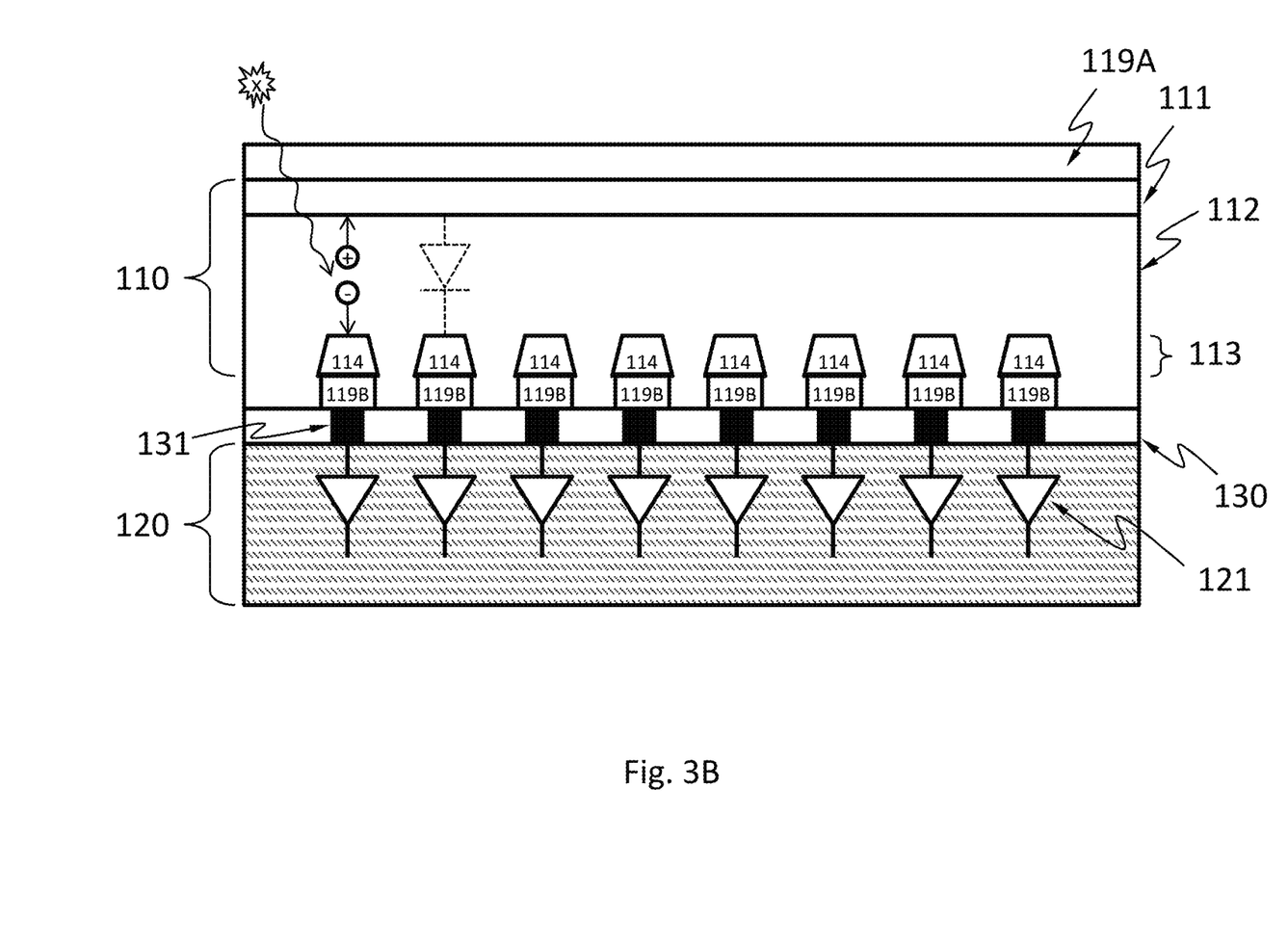
FIG. 3B schematically shows a detailed cross-sectional view of the radiation detector.

As shown in a detailed cross-sectional view of the radiation detector 100 in FIG. 3B, according to an embodiment, the radiation absorption layer 110 may include one or more diodes (e.g., p-i-n or p-n) formed by a first doped region 111, one or more discrete regions 114 of a second doped region 113. The second doped region 113 may be separated from the first doped region 111 by an optional the intrinsic region 112. The discrete regions 114 are separated from one another by the first doped region 111 or the intrinsic region 112. The first doped region 111 and the second doped region 113 have opposite types of doping (e.g., region 111 is p-type and region 113 is n-type, or region 111 is n-type and region 113 is p-type). In the example in FIG. 3B, each of the discrete regions 114 of the second doped region 113 forms a diode with the first doped region 111 and the optional intrinsic region 112. Namely, in the example in FIG. 3B, the radiation absorption layer 110 has a plurality of diodes having the first doped region 111 as a shared electrode. The first doped region 111 may also have discrete portions.

When radiation from the radiation source hits the radiation absorption layer 110 including diodes, the particle of radiation may be absorbed and generate one or more charge carriers by a number of mechanisms. The charge carriers may drift to the electrodes of one of the diodes under an electric field. The field may be an external electric field. The electric contact 119B may include discrete portions each of which is in electrical contact with the discrete regions 114. In an embodiment, the charge carriers may drift in directions such that the charge carriers generated by a single particle of the radiation are not substantially shared by two different discrete regions 114 ("not substantially shared" here means less than 2%, less than 0.5%, less than 0.1%, or less than 0.01% of these charge carriers flow to a different one of the discrete regions 114 than the rest of the charge carriers). Charge carriers generated by a particle of the radiation incident around the footprint of one of these discrete regions 114 are not substantially shared with another of these discrete regions 114. The pixel 150 associated with a discrete region 114 may be an area around the discrete region 114 in which substantially all (more than 98%, more than 99.5%, more than 99.9%, or more than 99.99% of) charge carriers generated by a particle of the radiation incident therein flow to the discrete region 114. Namely, less than 2%, less than 1%, less than 0.1%, or less than 0.01% of these charge carriers flow beyond the pixel.

Figure 3C:
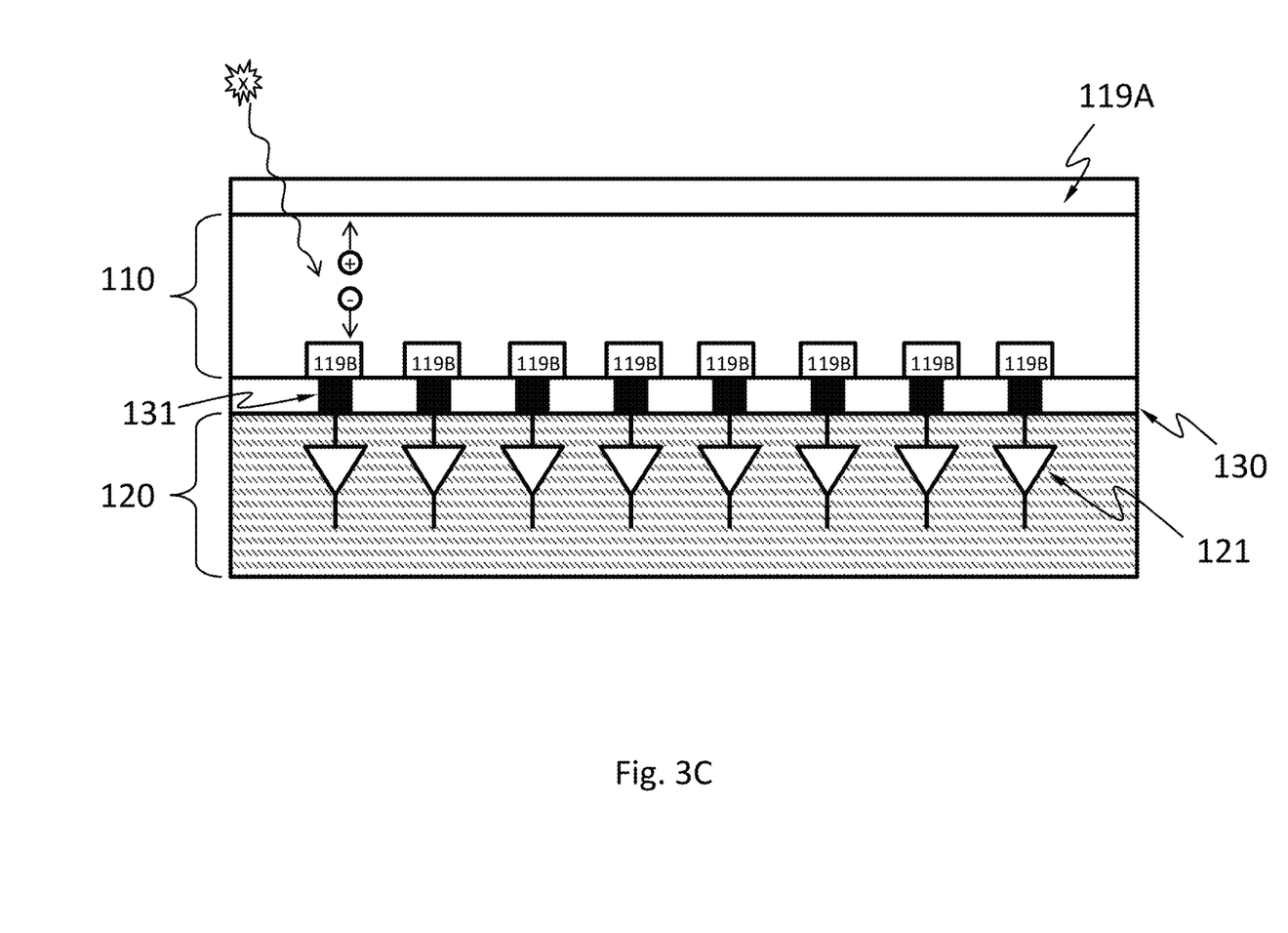
FIG. 3C schematically shows an alternative detailed cross-sectional view of the radiation detector.

As shown in an alternative detailed cross-sectional view of the radiation detector 100 in FIG. 3C, according to an embodiment, the radiation absorption layer 110 may include a resistor of a semiconductor material such as, silicon, germanium, GaAs, CdTe, CdZnTe, or a combination thereof, but does not include a diode. The semiconductor may have a high mass attenuation coefficient for the radiation of interest.

When the radiation hits the radiation absorption layer 110 including a resistor but not diodes, it may be absorbed and generate one or more charge carriers by a number of mechanisms. A particle of the radiation may generate 10 to 100000 charge carriers. The charge carriers may drift to the electric contacts 119A and 119B under an electric field. The field may be an external electric field. The electric contact 119B includes discrete portions. In an embodiment, the charge carriers may drift in directions such that the charge carriers generated by a single particle of the radiation are not substantially shared by two different discrete portions of the electric contact 119B ("not substantially shared" here means less than 2%, less than 0.5%, less than 0.1%, or less than 0.01% of these charge carriers flow to a different one of the discrete portions than the rest of the charge carriers). Charge carriers generated by a particle of the radiation incident around the footprint of one of these discrete portions of the electric contact 119B are not substantially shared with another of these discrete portions of the electric contact 119B. A pixel 150 associated with a discrete portion of the electric contact 119B may be an area around the discrete portion in which substantially all (more than 98%, more than 99.5%, more than 99.9% or more than 99.99% of) charge carriers generated by a particle of the radiation incident therein flow to the discrete portion of the electric contact 119B. Namely, less than 2%, less than 0.5%, less than 0.1%, or less than 0.01% of these charge carriers flow beyond the pixel associated with the one discrete portion of the electric contact 119B.

The electronics layer 120 may include an electronic system 121 suitable for processing or interpreting signals generated by the radiation incident on the radiation absorption layer 110. The electronic system 121 may include an analog circuitry such as a filter network, amplifiers, integrators, and comparators, or a digital circuitry such as a microprocessors, and memory. The electronic system 121 may include one or more ADCs. The electronic system 121 may include components shared by the pixels or components dedicated to a single pixel. For example, the electronic system 121 may include an amplifier dedicated to each pixel and a microprocessor shared among all the pixels. The electronic system 121 may be electrically connected to the pixels by vias 131. Space among the vias may be filled with a filler material 130, which may increase the mechanical stability of the connection of the electronics layer 120 to the radiation absorption layer 110. Other bonding techniques are possible to connect the electronic system 121 to the pixels without using vias.

The signals generated by the radiation incident on the radiation absorption layer 110 may be in a form of an electrical current. Likewise, the dark noise may also be in a form of an electrical current (e.g., a DC current flowing from the electric contacts 119B). If the current may be ascertained, the electrical current may be compensated for (e.g., by the amplifier 309 described herein).

Figure 4:
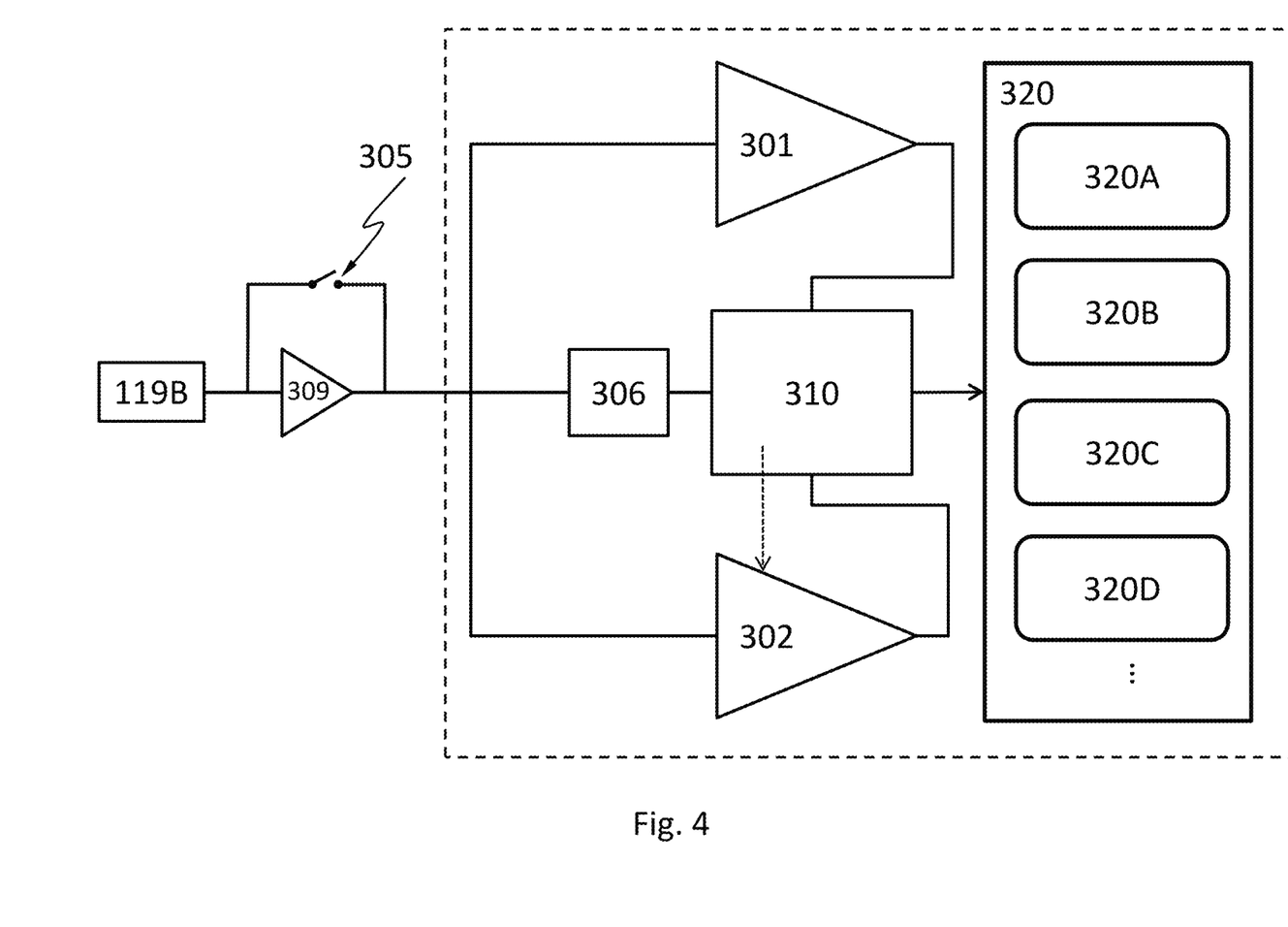
FIG. 4 schematically shows a component diagram of an electronic system of the radiation detector in FIG. 3B or FIG. 3C, according to an embodiment.

FIG. 4 show a component diagram of the electronic system 121, according to an embodiment. The electronic system 121 includes the amplifier 309 electrically connected to a discrete portion of the electric contact 119B. Charge carriers from the discrete portion of the electric contact 119B may accumulate in the amplifier 309 over a period of time ("integration period"). After the integration period has expired, the output of the amplifier 309 is sampled and optionally reset by an optional switch 305.

The dark noise in the form of an electric current charges the capacitor coupled with the amplifier 309 along with the signals generated by the radiation. The dark noise may be a very small current, such as in the range of picoamps (e.g., 1-1000 pA). Compensating for the dark noise may be performed by the amplifier 309. In one embodiment, the dark noise is measured when the radiation detector is not exposed to radiation. The electric signal Vcomp may be determined and applied to the adjustable current source 394 based on the measured dark noise. When the input of the amplifier 309 receive the first electric current comprising the dark noise (e.g., dark current), the adjustable current source 394 may feed the second electric current at an appropriate direction and magnitude to the op-amp 391 of the amplifier 309. The second electric current may be similar in magnitude but opposite in direction of the dark noise.

The electronic system 121 may further include a first voltage comparator 301, a second voltage comparator 302, a plurality of counters 320 (including counters 320A, 320B, 320C, 320D . . . ), the optional switch 305, a voltmeter 306 and a controller 310.

The first voltage comparator 301 is configured to compare the voltage of the discrete portion of the electric contact 119B to a first threshold. The first voltage comparator 301 may be configured to monitor the voltage directly, or calculate the voltage by integrating an electric current flowing through the discrete portion of the electric contact 119B over a period of time. The first voltage comparator 301 may be controllably activated or deactivated by the controller 310. The first voltage comparator 301 may be a continuous comparator. Namely, the first voltage comparator 301 may be configured to be activated continuously, and monitor the voltage continuously. The first voltage comparator 301 configured as a continuous comparator reduces the chance that the system 121 misses signals generated by an incident particle of radiation. The first voltage comparator 301 configured as a continuous comparator is especially suitable when the incident radiation intensity is relatively high. The first voltage comparator 301 may be a clocked comparator, which has the benefit of lower power consumption. The first voltage comparator 301 configured as a clocked comparator may cause the system 121 to miss signals generated by some incident particles of radiation. When the incident radiation intensity is low, the chance of missing an incident particle of radiation is low because the time interval between two successive particles is relatively long. Therefore, the first voltage comparator 301 configured as a clocked comparator is especially suitable when the incident radiation intensity is relatively low. The first threshold may be 1-5%, 5-10%, 10%-20%, 20-30%, 30-40% or 40-50% of the maximum voltage one incident particle of radiation may generate on the discrete portion of the electric contact 119B. The maximum voltage may depend on the energy of the incident particle of radiation (i.e., the wavelength of the incident radiation), the material of the radiation absorption layer 110, and other factors. For example, the first threshold may be 50 mV, 100 mV, 150 mV, or 200 mV.

The second voltage comparator 302 is configured to compare the voltage to a second threshold. The second voltage comparator 302 may be configured to monitor the voltage directly, or calculate the voltage by integrating an electric current flowing through the discrete portion of the electric contact 119B over a period of time. The second voltage comparator 302 may be a continuous comparator. The second voltage comparator 302 may be controllably activate or deactivated by the controller 310. When the second voltage comparator 302 is deactivated, the power consumption of the second voltage comparator 302 may be less than 1%, less than 5%, less than 10% or less than 20% of the power consumption when the second voltage comparator 302 is activated. The absolute value of the second threshold is greater than the absolute value of the first threshold. As used herein, the term "absolute value" or "modulus" |x| of a real number x is the non-negative value of x without regard to its sign. Namely, $$|x| = \begin{cases} x, & \text{if } x \geq 0 \\ -x, & \text{if } x \leq 0 \end{cases}.$$

The second threshold may be 200%-300% of the first threshold. For example, the second threshold may be 100 mV, 150 mV, 200 mV, 250 mV or 300 mV. The second voltage comparator 302 and the first voltage comparator 310 may be the same component. Namely, the system 121 may have one voltage comparator that can compare a voltage with two different thresholds at different times.

The first voltage comparator 301 or the second voltage comparator 302 may include one or more op-amps or any other suitable circuitry. The first voltage comparator 301 or the second voltage comparator 302 may have a high speed to allow the system 121 to operate under a high flux of incident radiation. However, having a high speed is often at the cost of power consumption.

The counters 320 may be a software component (e.g., numbers stored in a computer memory) or a hardware component (e.g., 4017 IC and 7490 IC). Each counter 320 is associated with a bin for an energy range. For example, counter 320A may be associated with a bin for 70-71 KeV, counter 320B may be associated with a bin for 71-72 KeV, counter 320C may be associated with a bin for 72-73 KeV, counter 320D may be associated with a bin for 73-74 KeV. When the energy of an incident particle of radiation is determined by the voltmeter 306 to be in the bin a counter 320 is associated with, the number registered in the counter 320 is increased by one.

The controller 310 may be a hardware component such as a microcontroller and a microprocessor. The controller 310 is configured to start a time delay from a time at which the first voltage comparator 301 determines that the absolute value of the voltage equals or exceeds the absolute value of the first threshold (e.g., the absolute value of the voltage increases from below the absolute value of the first threshold to a value equal to or above the absolute value of the first threshold). The absolute value is used here because the voltage may be negative or positive. The controller 310 may be configured to keep deactivated the second voltage comparator 302, the counter 320 and any other circuits the operation of the first voltage comparator 301 does not require, before the time at which the first voltage comparator 301 determines that the absolute value of the voltage equals or exceeds the absolute value of the first threshold. The time delay may expire after the voltage becomes stable, i.e., the rate of change of the voltage is substantially zero. The phase "the rate of change is substantially zero" means that temporal change is less than 0.1%/ns. The phase "the rate of change is substantially non-zero" means that temporal change of the voltage is at least 0.1%/ns.

The controller 310 may be configured to activate the second voltage comparator during (including the beginning and the expiration) the time delay. In an embodiment, the controller 310 is configured to activate the second voltage comparator at the beginning of the time delay. The term "activate" means causing the component to enter an operational state (e.g., by sending a signal such as a voltage pulse or a logic level, by providing power, etc.). The term "deactivate" means causing the component to enter a non-operational state (e.g., by sending a signal such as a voltage pulse or a logic level, by cut off power, etc.). The operational state may have higher power consumption (e.g., 10 times higher, 100 times higher, 1000 times higher) than the non-operational state. The controller 310 itself may be deactivated until the output of the first voltage comparator 301 activates the controller 310 when the absolute value of the voltage equals or exceeds the absolute value of the first threshold.

The controller 310 may be configured to cause the number registered by one of the counters 320 to increase by one, if, during the time delay, the second voltage comparator 302 determines that the absolute value of the voltage equals or exceeds the absolute value of the second threshold, and the energy of the particle of radiation falls in the bin associated with the counter 320.

The controller 310 may be configured to cause the voltmeter 306 to measure the voltage upon expiration of the time delay and to determine based on the voltage which bin the energy of the particle of radiation falls in.

The controller 310 may be configured to connect the discrete portion of the electric contact 119B to an electrical ground, so as to reset the voltage and discharge any charge carriers accumulated on the discrete portion of the electric contact 119B. In an embodiment, the discrete portion of the electric contact 119B is connected to an electrical ground after the expiration of the time delay. In an embodiment, the discrete portion of the electric contact 119B is connected to an electrical ground for a finite reset time period. The controller 310 may connect the discrete portion of the electric contact 119B to the electrical ground by controlling the optional switch 305. The switch may be a transistor such as a field-effect transistor (FET).

In an embodiment, the system 121 has no analog filter network (e.g., a RC network). In an embodiment, the system 121 has no analog circuitry.

The voltmeter 306 may feed the voltage it measures to the controller 310 as an analog or digital signal.

Figure 5:
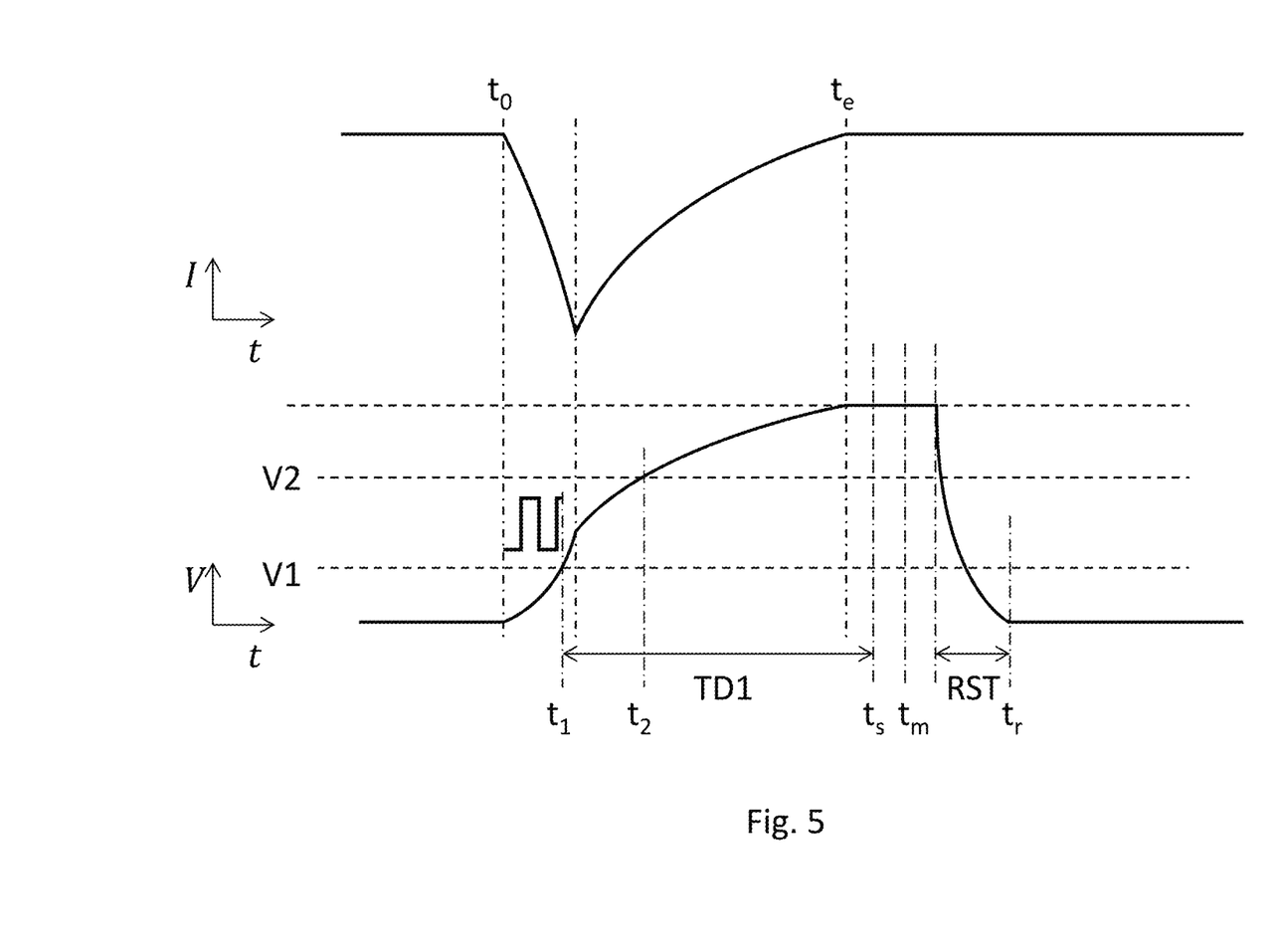
FIG. 5 schematically shows a temporal change of an electric current flowing through an electric contact (upper curve) caused by charge carriers generated by a particle of radiation incident on a pixel associated with the electric contact, and a corresponding temporal change of the voltage of the electric contact (lower curve).

FIG. 5 schematically shows a temporal change of the electric current flowing through the discrete portion of the electric contact 119B (upper curve) caused by charge carriers generated by a particle of radiation incident on the pixel 150 associated with the discrete portion of the electric contact 119B, and a corresponding temporal change of the voltage of the discrete portion of the electric contact 119B (lower curve). The voltage may be an integral of the electric current with respect to time. At time to, the particle of radiation hits the diode or the resistor, charge carriers start being generated in the pixel 150, electric current starts to flow through the discrete portion of the electric contact 119B, and the absolute value of the voltage of the discrete portion of the electric contact 119B starts to increase. At time $t_1$, the first voltage comparator 301 determines that the absolute value of the voltage equals or exceeds the absolute value of the first threshold V1, and the controller 310 starts the time delay TD1 and the controller 310 may deactivate the first voltage comparator 301 at the beginning of TD1. If the controller 310 is deactivated before $t_1$, the controller 310 is activated at $t_1$. During TD1, the controller 310 activates the second voltage comparator 302. The term "during" a time delay as used here means the beginning and the expiration (i.e., the end) and any time in between. For example, the controller 310 may activate the second voltage comparator 302 at the expiration of TD1. If during TD1, the second voltage comparator 302 determines that the absolute value of the voltage equals or exceeds the absolute value of the second threshold at time $t_2$, the controller 310 waits for stabilization of the voltage to stabilize. The voltage stabilizes at time $t_e$, when all charge carriers generated by the particle of radiation drift out of the radiation absorption layer 110. At time $t_s$, the time delay TD1 expires. In the example of FIG. 4, time $t_s$ is after time $t_e$; namely TD1 expires after all charge carriers generated by the particle of radiation drift out of the radiation absorption layer 110. The rate of change of the voltage is thus substantially zero at $t_5$. The controller 310 may be configured to deactivate the second voltage comparator 302 at expiration of TD1 or at $t_2$, or any time in between.

The controller 310 may be configured to cause the voltmeter 306 to measure the voltage upon expiration of the time delay TD1. In an embodiment, the controller 310 causes the voltmeter 306 to measure the voltage after the rate of change of the voltage becomes substantially zero after the expiration of the time delay TD1. The voltage at this moment is proportional to the amount of charge carriers generated by a particle of radiation, which relates to the energy of the particle of radiation. The controller 310 may be configured to determine the energy of the particle of radiation based on voltage the voltmeter 306 measures. One way to determine the energy is by binning the voltage. The counter 320 may have a sub-counter for each bin. When the controller 310 determines that the energy of the particle of radiation falls in a bin, the controller 310 may cause the number registered in the sub-counter for that bin to increase by one. Therefore, the system 121 may be able to detect a radiation image and may be able to resolve particle of radiation energies of each particle of radiation.

After TD1 expires, the controller 310 connects the discrete portion of the electric contact 119B to an electric ground for a reset period RST to allow charge carriers accumulated on the discrete portion of the electric contact 119B to flow to the ground and reset the voltage. After RST, the system 121 is ready to detect another incident particle of radiation. If the first voltage comparator 301 has been deactivated, the controller 310 can activate it at any time before RST expires. If the controller 310 has been deactivated, it may be activated before RST expires.

The radiation detector 100 described here may have other applications such as in an X-ray telescope, X-ray mammography, industrial X-ray defect detection, X-ray microscopy or microradiography, X-ray casting inspection, X-ray non-destructive testing, X-ray weld inspection, X-ray digital subtraction angiography, etc. It may be suitable to use this radiation detector 100 in place of a photographic plate, a photographic film, a PSP plate, an X-ray image intensifier, a scintillator, or an X-ray detector.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. An amplifier, comprising:
an op-amp configured to receive at an input thereof a first electric current;
a first MOS capacitor connected to the input and an output of the op-amp;
an adjustable current source feeding a second electric current to the input;
wherein the adjustable current source is adjustable by an electric signal;
wherein the adjustable current source comprises a second MOS capacitor;
wherein the adjustable current source comprises a third MOS capacitor in parallel to the second MOS capacitor; wherein a gate electrode of the second MOS capacitor is connected to the input and a bulk contact of the third MOS capacitor is connected to the input;
wherein a gate electrode of the third MOS capacitor is connected to the input of the op-amp and a bulk contact of the third MOS capacitor is connected to the electric signal.

2. The amplifier of claim 1, wherein the first MOS capacitor is a MOSFET with its source electrode shorted to its drain electrode.

3. The amplifier of claim 2, wherein the source electrode and the drain electrode are connected to the output of the op-amp, and a gate electrode of the MOSFET is connected to the input of the op-amp.

4. The amplifier of claim 2, wherein the source electrode and the drain electrode are connected to the input of the op-amp, and a gate electrode of the MOSFET is connected to the output of the op-amp.

5. The amplifier of claim 1, wherein the first electric current comprises a dark noise of a radiation detector; wherein the adjustable current source is configured to compensate for the dark noise.

6. The amplifier of claim 1, further comprising a processor configured to generate the electric signal based on a level at the output.

7. The amplifier of claim 6, wherein the processor is configured to generate the electric signal further based on an output of a comparator.

8. The amplifier of claim 6, wherein the processor comprises a charge pump.

9. The amplifier of claim 8, wherein the charge pump is configured to be switched on and off by a clock signal.

10. A radiation detector comprising:
a radiation absorption layer comprising an electrode;
the amplifier of claim 1, wherein the first electric current is from the electrode and the amplifier is configured to produce a voltage at the output based on the first electric current;
a first voltage comparator configured to compare the voltage to a first threshold;
a second voltage comparator configured to compare the voltage to a second threshold;
a counter configured to register a number of particles of radiation absorbed by the radiation absorption layer;
a controller;
wherein the controller is configured to start a time delay from a time at which the first voltage comparator determines that an absolute value of the voltage equals or exceeds an absolute value of the first threshold;
wherein the controller is configured to activate the second voltage comparator during the time delay;
wherein the controller is configured to cause the number registered by the counter to increase by one, if the second voltage comparator determines that an absolute value of the voltage equals or exceeds an absolute value of the second threshold.

11. The radiation detector of claim 10, wherein the radiation is X-ray.

12. The radiation detector of claim 10, wherein the controller is configured to activate the second voltage comparator at a beginning or expiration of the time delay.

13. The radiation detector of claim 10, further comprising a voltmeter, wherein the controller is configured to cause the voltmeter to measure the voltage upon expiration of the time delay.

14. The radiation detector of claim 10, wherein the controller is configured to determine radiation of a particle of radiation based on a value of the voltage measured upon expiration of the time delay.

15. The radiation detector of claim 10, wherein a rate of change of the voltage is substantially zero at expiration of the time delay.

16. The radiation detector of claim 10, wherein the radiation detector does not comprise a scintillator.

* * * * *